United States Patent [19]

Houston

[11] Patent Number: 5,023,874
[45] Date of Patent: Jun. 11, 1991

[54] SCREENING LOGIC CIRCUITS FOR PREFERRED STATES

[75] Inventor: Theodore M. Houston, Richardson, Tex.

[73] Assignee: Texas Instruments Incorporated, Dallas, Tex.

[21] Appl. No.: 314,619

[22] Filed: Feb. 23, 1989

[51] Int. Cl.$^5$ .............................................. G06F 11/00
[52] U.S. Cl. .................................. 371/21.2; 371/21.4
[58] Field of Search ................... 371/21.2, 21.3, 21.4, 371/21.1, 28, 66, 24; 365/201, 226, 227, 228

[56] References Cited

U.S. PATENT DOCUMENTS

| | | | |
|---|---|---|---|
| 3,618,030 | 11/1971 | Creasy | 371/28 X |
| 3,969,618 | 7/1976 | Strubel | 371/21.2 |
| 4,061,908 | 12/1977 | de Jonge | 371/21.3 |
| 4,418,403 | 11/1983 | O'Toole | 371/28 X |
| 4,503,538 | 5/1985 | Fritz | 371/28 |
| 4,553,225 | 11/1985 | Ohe | 371/21.4 X |
| 4,646,307 | 2/1987 | Nishimura | 371/66 X |
| 4,680,762 | 7/1987 | Hardee | 371/21.2 X |
| 4,819,237 | 4/1989 | Hamilton | 371/21.2 X |

Primary Examiner—Jerry Smith
Assistant Examiner—Robert W. Beausoliel
Attorney, Agent, or Firm—James C. Kesterson; James T. Comfort; Melvin Sharp

[57] ABSTRACT

A test for screening integrated circuits with weak cells comprises storing a known pattern into the cells, interrupting the power to the cells, and comparing the data in the cells upon power-up with the data originally stored therein. The test may be repeated using the complement of the first pattern. Those devices which retain the stored pattern despite the power interruption may be classified as resistant to upset.

12 Claims, 1 Drawing Sheet

SCREENING LOGIC CIRCUITS FOR PREFERRED STATES

TECHNICAL FIELD OF THE INVENTION

This invention relates in general to integrated circuits, and more particularly to a method and apparatus for screening memory circuits for preferred states to detect circuits having weak cells.

BACKGROUND OF THE INVENTION

To ensure the operability of a memory cell, including storage devices such as registers or latches, each individual device is tested after fabrication. The devices are tested by storing a known pattern into the stored cells of the device and subsequently reading the contents of the device. If the data input to the device is not identical to the data output from the device, then the device is discarded as having one or more failed cells. To detect hard failures, where a memory cell is always one or always zero, the device is tested with different patterns, such that each cell is tested for its ability to successfully store both logic states.

Where higher reliability is needed, more extensive testing may be performed on the devices. For example, the devices may be tested at different temperature ranges to ensure the operability of the device over a specified temperature range. Similarly, the device may be tested over a specified voltage range to determine failures. In some instances, the devices will be tested after a prescribed "burn-in" period, typically, 24 to 48 hours, wherein the device is operated during the burn-in period. If the device is likely to fail during operation, it has been found that there is a high probability that the chip will fail during the burn-in period.

Nevertheless, the operational testing does not detect all errors which may occur due to processing variations and inaccuracies. A memory device may fail because some of its cells are "weak," i.e., they may be prone to upset, wherein the stored cell may flip from the stored logic state to the complementary logic state. Upset may occur in a weak cell due to several external factors. Alpha particles emitted from the packaging materials may cause a weak memory cell to switch states. Similarly, a high energy ion may impinge the memory cell, leaving electron/hole pairs which cause the cell to upset. This phenomena is known as single event upset, or SEU. Further, a burst of gamma radiation may generate electron hole pairs which push the voltage toward the mid-rail, causing the memory cell to switch states. A memory device's immunity to gamma radiation is known as its transient dose hardness.

Therefore, a need has arisen in the industry for a test which will detect weak memory cells in a storage device.

SUMMARY OF THE INVENTION

In a first embodiment of the present invention, a known pattern of logic values is stored into a storage device, such as a random access memory, register or latch. The power to the storage device is interrupted for a nominal time period, after which the data in the storage device is read. The data in the storage device is compared with the pattern previously stored in the storage device to determine whether any of the storage cells have changed logic states.

This aspect of the present invention has the technical advantage that cells having a preferred state can be detected. The more balanced the cell, the longer the stored state will be retained without power. The more imbalanced the cell, the sooner it will switch from the stored state to the preferred state once power is interrupted. Cells having a preferred state can be detected and classified as more prone to upset and as having a lower transient dose hardness.

In a second aspect of the present invention, a known pattern is stored into the cells of a storage device and power is interrupted to the cells for a nominal time period. After comparing the data in the cell with the pattern previously stored therein, the logical complement of the known pattern is stored into the cell. Once again, power to the storage device is interrupted and the data stored therein is compared to the complement of the known pattern.

This aspect of the present invention will determine whether any cells of the storage device have a preference toward either logical state.

In a third aspect of the present invention, the nominal time period for which the power is interrupted is varied. The storage devices may be classified into groups corresponding to the time period at which one or more cells fails. This aspect of the invention provides the ability to classify storage devices into various reliability categories for different applications.

BRIEF DESCRIPTION OF THE DRAWING

For a more complete understanding of the present invention and the advantages thereof, reference is now made to the following description taken in conjunction with the accompanying drawing, in which.

DETAILED DESCRIPTION OF THE INVENTION

Figure 1:
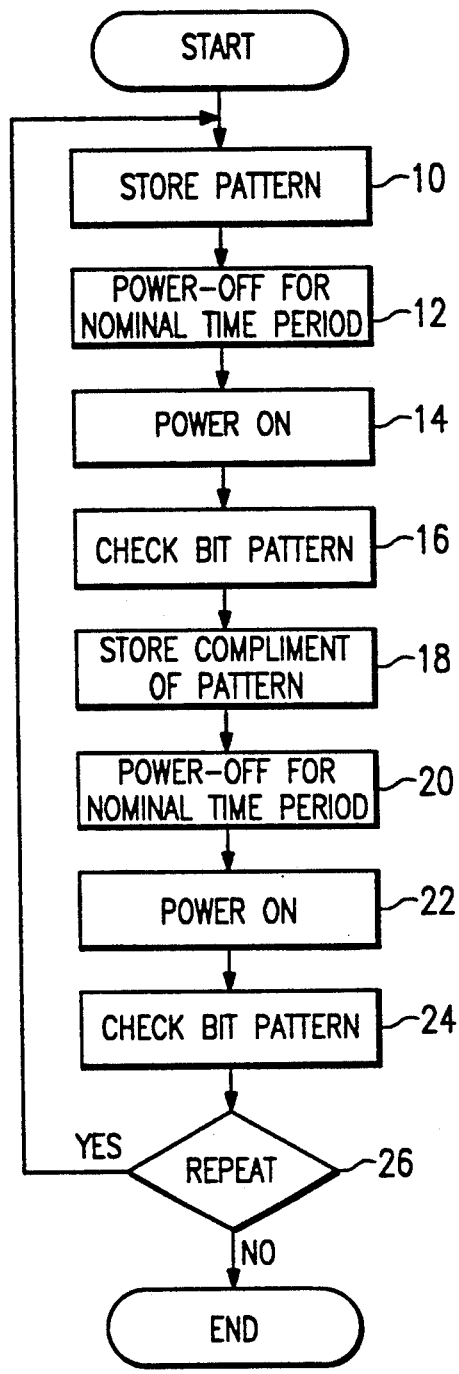
FIG. 1 illustrates a flow chart describing the screening test of the present invention.

The preferred embodiment of the present invention is best understood by referring to FIG. 1.

During the fabrication of an integrated circuit, processing variations are certain to occur between different wafers, and between different circuits on a single wafer. For example, line widths, implant densities, and oxide thicknesses may vary from the optimum within a certain degree from circuit to circuit. To some extent, these variations are always present.

Processing variations may cause some cells to have a preference to a logical state, either a "1" or "0." As the voltage stored in the cells approaches a mid-rail between a logical "0" and a logical "1", the storage cell will tend to latch onto the voltage in accordance with its preference. In other words, a cell having a preference towards a logical "1" will respond to a voltage near the mid-rail as being set to a "1", while a cell having a preference towards logical "0" will tend to respond to a voltage near the mid-rail as being set to a "0". The preference may be either slight or strong depending on the degree of process variations; in an extreme case, a cell may respond to all input voltages as either logical "1s" or logical "0s".

Under normal circumstances, a storage cell with a preference will operate normally if the preference is not too strong. However, less perturbation, such as from alpha particles or high energy ions, is required to upset the cell from its unpreferred state to its preferred state than would be required to upset a balanced cell.

Thus, by determining which devices have cells with preferred states, storage devices can be screened to determine those less likely to encounter upset.

FIG. 1 illustrates a flow chart for a screening test to determine which devices have cells with preferred states. For purposes of illustration, FIG. 1 will be described in connection with a static RAM (SRAM); however, it should be noted that the test illustrated in FIG. 1 should be able to determine weak cells in other devices such as registers, latches, microprocessors having internal storage memories, psuedo-static DRAMs, FIFOs, etc.

In block 10, a pattern of logical values is stored into the SRAM. For example, a logical "1" could be written into all the memory locations in the SRAM.

In block 12, the power to the SRAM is turned off for a nominal time period. The method for determining the nominal time period is discussed hereinbelow.

In block 14, power is restored to the SRAM. Under normal circumstances, a fully discharged SRAM will have random logical values in its cells at power-up. However, once data is written into the cells, the power may be turned off for a short time period without the data being lost. If, however, the SRAM has one or more cells with preferred logical states, those cells will switch to their preferred state when power is turned back on. The longer the time period for power-off, the more likely that the cell with the preferred state will actually switch to that state.

In block 16, the data is read from the SRAM and compared to the stored pattern in block 10. For example, if all "1s" were stored in block 10, the data read from the SRAM in block 16 should be all "1s" as well. If any "0s" are present, then it can be determined that the cell has a preference towards a logical "0".

In block 18, a complementary pattern is stored in the SRAM. Thus, if all "1s" were stored in block 10, then all "0s" would be stored in the SRAM in block 18. Once again, in block 20, the power is turned off for a nominal time period. In block 22, power is restored and, in block 24, the bit pattern is read from the SRAM and, compared to the complementary pattern stored in block 18. If one or more of the cells of the SRAM have stored "1s", then the cells may be classified as having a preference towards a logical "1".

In block 26, the test may be repeated a number of times for greater accuracy. By repeating the test, cells which may be weak in either direction may be detected.

The nominal time period for power interruption may be determined empirically by using a benchmark test cell. The test may be performed on the benchmark test cell several times using increasingly longer time periods. At some point, the benchmark test cell will no longer be able to retain this information and errors will be seen in blocks 16 and 24 of FIG. 1. Using the longest time at which the benchmark test cell does not show errors as the nominal time period, devices may be classified in relation to the benchmark. It should be noted that the nominal time period may differ for different devices, a 16K SRAM may have a different nominal time period than a 256K SRAM, even though the probability of upset in both cells is substantially the same. Also, the interrupt time may be set for a duration shorter than that found for the benchmark cell.

In an alternative embodiment, each cell is tested over a range of interrupt times until failure occurs, and the parts are categorized accordingly. In this embodiment, a benchmark time period is not required.

Although FIG. 1 has been described using patterns of all "1s" and all "0s", other patterns can be used if desired, such as alternating "0s" and "1s". In some circumstances, the preference of one cell may be influenced by the value stored in adjacent cells; therefore, it may be desirable to use a plurality of different patterns in testing the devices. However, during the test, each cell should have at least one logical "1" and one logical "0" written to it, such that the preference for either value may be determined.

Also, it should be noted that while FIG. 1 has been discussed in relation to an SRAM, many different devices may also be tested using the present invention. Any device which will normally power up in a random state may be screened using the test of the present invention. Such devices would include registers, latches, pseudo-static DRAMs, and similar devices used within larger integrated circuits such as microprocessors.

Additionally, the test of the present invention may be used in conjunction with other qualifying factors. For example, the test could be performed over different temperature and input voltage ranges, or other environmental ranges, to determine different classifications of reliability. Further, the devices could be tested over a range of nominal time periods, to determine the degree to which the devices are resistant to upset. Thus, the devices could be easily matched to the specific applications in which they are used.

It should also be noted that this test can be used to qualify a wafer or lot for retention time as a combined test for capacitance, uniformity and leakage. Thus, the retention time for a "balanced" cell may be determined by following the procedure described above for determining the nominal time period for power interruption.

Although the preferred embodiment of the invention has been described in detail, it should be understood that the various changes, substitutions and alterations can be made therein without departing from the spirit and scope of the invention as defined by the appended claims.

What is claimed is:

1. A method of testing a circuit having one or more memory cells, comprising the steps of:
   storing a logical state according to a selected pattern in each memory cell of said circuit under test;
   turning off the power to each of the cells;
   turning on the power to each of the cells after a selected time period; and
   comparing the logical state present in each cell with said stored logical state after power has been turned back on to said cells to determine if any of the cells have switched to another logical state.

2. The method of claim 1 and further comprising the steps of repeating said storing, turning off the power, turning on the power, and comparing steps a predetermined number of times.

3. The method of claim 1 and further comprising the steps of storing, turning off the power, turning on the power, and comparing for a plurality of known time periods to categorize the storage device in different reliability classifications.

4. The method of claim 1 and further comprising the step of repeating said steps of storing, turning off the power, turning on the power, and comparing for a plurality of voltage supply levels to the storage device to categorize the storage devices in different reliability classifications.

5. The method of claim 1 and further comprising the step of repeating said steps of storing, turning off the power, turning on the power, and comparing for a plurality of temperature levels to categorize the storage devices in different reliability classifications.

6. A storage device tested for reliability by the process of claim 1.

7. The method of claim 1 further comprising the steps of:
storing the complement of the logical state previously stored in each memory cell under test;
turning off the power to each of the cells;
turning on the power to each of the cells after a selected time period; and
comparing the logical state present in each cell with said stored complement logical state after power has been turned back on to said cells to determine if any of the cells have switched to another logical state.

8. The method of claim 1 and further comprising the steps of:
storing selected logical states according to a different selected pattern in each memory cell of said circuitry under test;
turning off the power to each of the cells;
turning on the power to each of the cells after a selected time period; and
comparing the logical state present in each cell with said different selected pattern after power has been turned back on to said cells to determine if any of the cells have switched to another logical state.

9. The method of claim 1 wherein said selected time period is a benchmark time period and further comprising the steps of determining said benchmark time period.

10. The method of claim 9 wherein said determining step comprises the steps of:

storing a logical state according to a selected pattern and each memory cell of said benchmark memory device;
turning off the power to each of said cells in said benchmark device;
turning on the power to each of said cells in said benchmark device after a selected time period;
comparing the logical state present in each cell of said benchmark device with said stored logical state after power has been turned back on to determine if any of the cells have switched to another logical state; and
repeating said steps of storing, turning power off, turning power on, and comparing, until errors are detected for one or more of said cells said selected time period being increased for each repetition of said steps.

11. A method of testing a storage device with one or more storage cells comprising the steps of:
storing a logical state according to a selected pattern in each memory cell of said circuit under test;
turning off the power to each of the cells;
turning on the power to each of the cells after a selected time period;
comparing the logical state present in each cell with said selected pattern after power has been turned back on to determine if any of the cells have switched to another state;
storing the complement of the logical state in each memory cell from that previously stored;
turning off the power to each of the cells;
turning on the power to each of the cells after a selected time period; and
comparing the logical state present in each cell with said stored complement logical state after power has been turned back on to determine if any of the cells have switched to another state.

12. A storage device tested for reliability by the process of claim 10.